United States Patent [19]

Yamamoto

[11] Patent Number: 5,510,719
[45] Date of Patent: Apr. 23, 1996

[54] METHOD FOR SCREENING EARLY FAILURE OF CERAMIC CAPACITOR

[75] Inventor: Shigekatsu Yamamoto, Nagaokakyo, Japan

[73] Assignee: Murata Manufacturing Co., Ltd., Japan

[21] Appl. No.: 291,158

[22] Filed: Aug. 16, 1994

[30] Foreign Application Priority Data

Aug. 20, 1993 [JP] Japan .................................. 5-206531

[51] Int. Cl.⁶ .................................................. G01R 31/12
[52] U.S. Cl. ...................... 324/548; 324/501; 324/678; 324/679; 209/574; 320/1
[58] Field of Search ............................... 324/548, 555, 324/658, 678, 679, 684, 685, 690, 501; 209/574; 320/1

[56] References Cited

U.S. PATENT DOCUMENTS

| | | | |
|---|---|---|---|
| 3,255,409 | 6/1966 | Sztybel | 324/548 |
| 3,886,447 | 5/1975 | Tanaka | 324/678 |
| 3,934,195 | 1/1976 | Shires | 324/548 |
| 4,931,721 | 6/1990 | Berrigan et al. | 324/548 |
| 5,101,106 | 3/1992 | Cox et al. | 324/501 X |

FOREIGN PATENT DOCUMENTS

| | | | |
|---|---|---|---|
| 2404885 | 8/1975 | Germany | 324/548 |
| 294813 | 10/1991 | Germany | 324/548 |

*Primary Examiner*—Kenneth A. Wieder
*Assistant Examiner*—Glenn W. Brown
*Attorney, Agent, or Firm*—Ostrolenk, Faber, Gerb & Soffen

[57] ABSTRACT

A method of screening ceramic capacitors. The method includes the steps of: charging the ceramic capacitors by applying a constant d.c. voltage which is larger than the rated voltage and smaller than the breakdown voltage; and leaving the charged ceramic capacitor in a temperature around the maximum working temperature for a specific period of time with both terminals of each ceramic capacitor opened electrically; and eliminating defective capacitors whose residual voltage values are smaller than a specific voltage value.

6 Claims, 2 Drawing Sheets

METHOD FOR SCREENING EARLY FAILURE OF CERAMIC CAPACITOR

BACKGROUND OF THE INVENTION

1. Field of the Invention

The present invention relates to a method for screening early failure of a ceramic capacitor.

2. Description of Related Art

Recently, with the downsizing of various electronic devices, downsizing of electronic parts used in these electronic devices is also strongly requested. Thus, in a capacitor, which is a representative of such electronic parts, a small-sized laminated ceramic capacitor with large capacitance is generally used. In this type of capacitor, the downsizing is carried out by thinning dielectric layers by using a material with high dielectric constant, and a high capacitance is obtained by enlarging a laminated area of the electrodes.

However, in such laminated ceramic capacitors, as explained above, since the dielectric layers are thinned and the laminated area of the inner electrodes is enlarged (the number of laminate layers is increased), the probability of having minute defects in the thin dielectric layers becomes higher, and thus, early failure is apt to occur, which causes lowering of reliability.

Conventionally, in order to screen and eliminate laminated ceramic capacitors which have defects in the dielectric layers, a method has been used wherein the insulation resistance value of each capacitor is measured while applying a rated voltage or a voltage multiplied by several times, at room temperature.

In the laminated ceramic capacitors which have defects in the dielectric layers, some are of a type whose insulation resistance value fluctuates between a nondefective range and a defective range, and some are of a type whose insulation resistance value is deteriorated at a high temperature. However, in the conventional insulation resistance measuring method, since the measurement is carried out at room temperature for a relatively short voltage applying time and since the number of times of measurement is limited to one or two in order to maintain high productivity, it is difficult to detect the type whose insulation resistance value fluctuates when the voltage is applied. Further, it is impossible to detect the type whose insulation resistance is deteriorated in a high temperature.

On the other hand, in order to eliminate capacitors which have defects in the dielectric layers and may cause failure, a method is also used wherein the rated voltage or the voltage multiplied by several times is applied continuously for between several hours and several hundred hours and thereafter the insulation resistance value is measured. However, this method is inferior in mass productivity and raises the cost of the products. Thus, this method can only be used for capacitors of limited use which require especially high reliability.

SUMMARY OF THE INVENTION

An object of the present invention is to provide a method for screening and eliminating ceramic capacitors which have defects in the dielectric layers and may cause an early failure, the method being carried out in a simple process with high accuracy at a low cost.

In order to attain the object, according to the present invention, a method for screening ceramic capacitors which have early failure comprises a process of charging the ceramic capacitors by applying a constant d.c. voltage which is larger than the rated voltage and smaller than the breakdown voltage of the capacitors, a process of opening both terminals of each of the charged capacitors electrically and leaving the capacitors at a temperature around the maximum working temperature for a specific period of time, and a process of measuring the residual voltage values of the ceramic capacitors and eliminating capacitors whose voltage values are smaller than a specific voltage value as defectives.

The screening method according to the present invention is based on differences in self discharge characteristics at a high temperature of the ceramic capacitors. An internally defective capacitor whose insulation resistance value fluctuates or is deteriorated at a high temperature has a large amount of self discharge after charging, compared to a normal product which has no internal defect. Thus, lowering of the voltage between the terminals becomes large. Therefore, the presence of the internal defect in the dielectric layers of a ceramic capacitor can be detected by measuring the residual voltage value between the terminals which have been opened electrically for a specific period of time after charging. Thus, according to the present invention, defectives can be screened and eliminated in a simple process with high accuracy, and ceramic capacitors with high reliability can be provided at a low cost.

BRIEF DESCRIPTION OF THE DRAWINGS

This and other objects and features of the present invention will become apparent from the following description with reference to the accompanying drawings, of in which.

DETAILED DESCRIPTION OF THE PREFERRED EMBODIMENTS

The description of a preferred embodiment according to the present invention is given below, referring to the accompanying drawings.

First, a hundred pieces of laminated ceramic capacitors which have dielectric layers made of ceramic mainly composed of $BaTiO_3$, a capacitance of 1 µF and a rated voltage of 50 volts d.c. are provided as test pieces. Next, 50 volts d.c. is applied to these laminated ceramic capacitors for two minutes at a temperature of 85° C., and then the insulation resistance value of each capacitor is measured. This is a preliminary process to confirm nondefectives and eliminate defectives beforehand.

Next, a residual voltage value measuring process is carried out wherein each laminated ceramic capacitor is charged at the ordinary temperature and then left at a high temperature for a specific period of time, and then each residual voltage value is measured.

Figure 1:
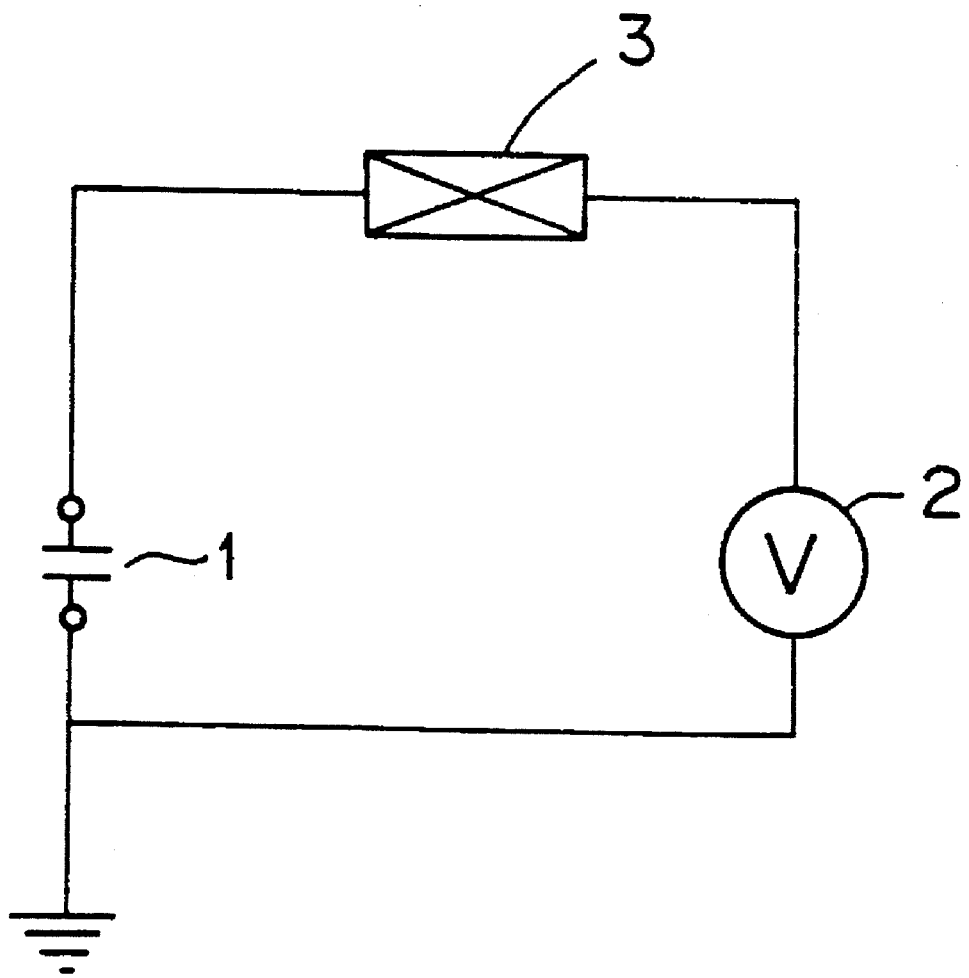
FIG. 1 shows a circuit diagram for measuring a residual voltage value according to an embodiment of the present invention.

Specifically, first, each ceramic capacitor is charged by applying 64 volts d.c. at the ordinary temperature for ten seconds. Next, charged laminated ceramic capacitors are set on an insulating plate made of silicone resin which has a surface resistance value of $10^{11}$ Ω or greater. With both terminals of the capacitors electrically open, the capacitors are left at a temperature of 85° C. (in an oven) for thirty minutes. After that, the capacitors are returned to the ordinary temperature, and the voltage between the terminals of each capacitor is measured. FIG. 1 shows a circuit for the measurement. In FIG. 1, a buffer 3 is inserted between a capacitor 1 and a measuring apparatus 2. The buffer 3 has a high input impedance and this prevents sudden discharge of the capacitor 1 to the measuring apparatus 2 during the measurement.

For confirmation, a reliability evaluating test is carried out on the capacitors which have finished the residual voltage value measuring process. In this test, 100 volts d.c. is applied to the capacitors at a temperature of 85° C.

Figure 2:
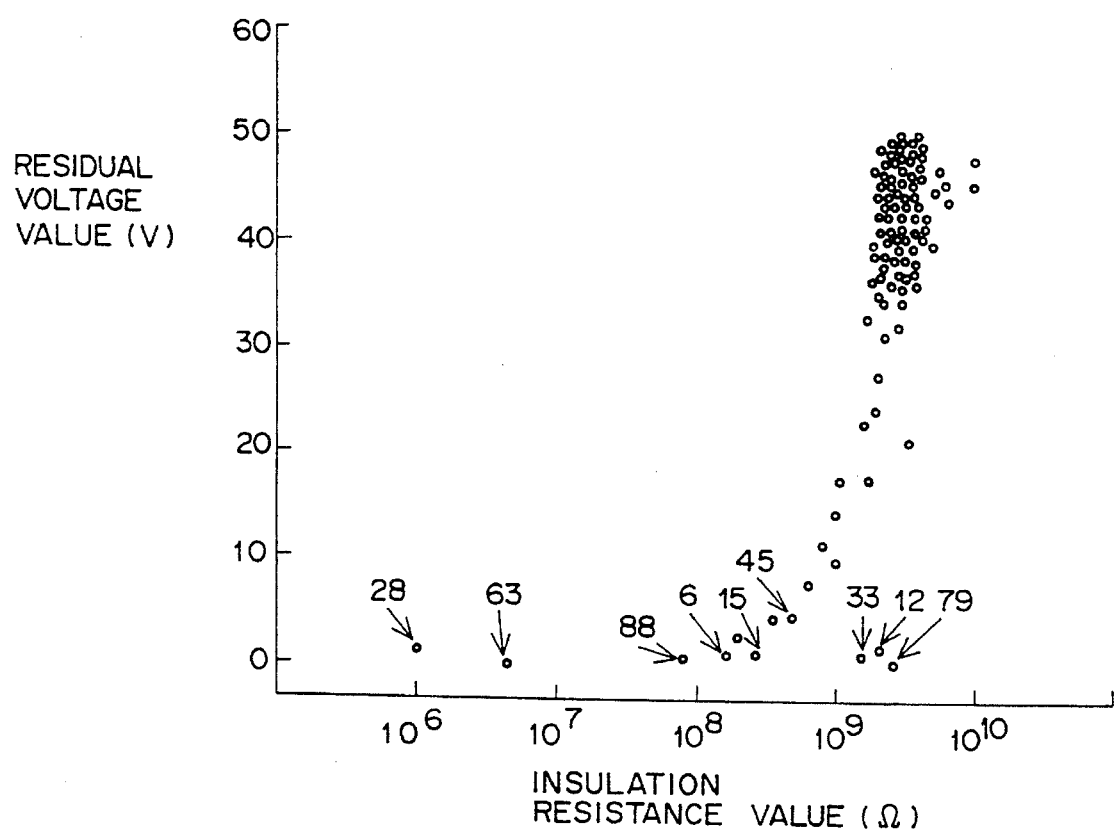
FIG. 2 is a graph which shows a relationship between an insulation resistance value and the residual voltage value of a ceramic capacitor.

FIG. 2 shows a relationship between the insulation resistance value which is measured in the preliminary process and the residual voltage value which is measured in the residual voltage value measuring process. In FIG. 2, capacitors which are determined to have early failure in the reliability evaluating test are indicated with sample numbers.

FIG. 2 proves that there is a major correlation between the insulation resistance value and residual voltage value at the temperature of 85° C. Also, while the insulation resistance values of most capacitors at the temperature of 85° C. are at a level of $10^9 \Omega$ which is normal, the insulation resistance values of some (sample numbers 12, 33 and 79) capacitors are extremely low. These low-valued capacitors are determined to have early failure in the reliability evaluating test.

According to the above correlation, ceramic capacitors which have defects in the dielectric layers and may have early failure can be easily screened and eliminated by leaving charged capacitors in a high temperature for an hour and then measuring the residual voltage value to select each capacitor whose voltage value is less than a specified value (30 V in the present embodiment) as a defective.

Also, in the residual voltage measuring process, the temperature at which both terminals of the ceramic capacitors are electrically open is not limited to 85° C. and can be set around the maximum working temperature according to the materials and the designing specifications of the sample ceramic capacitors, for example, between 85° and 150° C. Also, the applied voltage for charging each capacitor is not limited to 64 volts d.c. and can be any voltage which is smaller than the breakdown voltage and preferably larger than the rated voltage.

Also, though the charging of the ceramic capacitors and measurement of the residual voltage values are carried out at the ordinary temperature in the above embodiment, these also can be conducted at a high temperature (temperature around the maximum working temperature). Also, the charging time of the ceramic capacitors is set longer than a time actually required to complete the charging. Since the time required for the charging depends on the material of the dielectric layers of the ceramic capacitors, the capacitance or the charged voltage, the charging time should be determined from the result of a prior test to find out a charging time to provide a specific insulation resistance value.

Also, as a method of opening both terminals of the ceramic capacitors electrically after the charging, besides the setting of the ceramic capacitors on the insulating plate as described above, for example, it is possible to open a charged circuit electrically with each ceramic capacitor held between the charging terminals.

Further, leakage current of the ceramic capacitors except for the self discharge is needed to be prevented, and therefore, insulation between the terminals is necessary. For this purpose, when the insulating plate is used as described in the above embodiment, a material of the insulating plate is selected such that the surface resistance value of the insulating plate may be larger than the insulation resistance value of the ceramic capacitors.

Also, the time for leaving the capacitors after the charging is not limited to thirty minutes as described in the above embodiment. Considering the self discharge characteristic of the ceramic capacitors in normal condition, ceramic capacitors which have defects can be screened with high accuracy by leaving the capacitors for around a time when the voltage between the terminals of a capacitor in normal condition starts to decrease by self discharge.

Although the present invention has been described in connection with the preferred embodiment above, it is to be noted that various changes and modifications are apparent to a person skilled in the art. Such changes and modifications are to be understood as being within the scope of the present invention.

What is claimed is:

1. A method of screening early failure of ceramic capacitors comprising the steps of:

charging each ceramic capacitor by applying a d.c. voltage which is larger than a rated voltage of the ceramic capacitor and smaller than a breakdown voltage of the ceramic capacitor;

opening both terminals of each of the charged ceramic capacitors electrically, and leaving the capacitors for a predetermined period of time at a temperature around a predetermined maximum working temperature;

measuring residual voltage values of the ceramic capacitors after said predetermined period of time, identifying capacitors whose residual voltage values are smaller than a predetermined voltage value as being defective, and eliminating such defective capacitors.

2. A screening method as claimed in claim 1, further comprising the step of connecting a high input impedance buffer in series between the capacitor and a measuring apparatus while the residual voltage value of each ceramic capacitor is measured.

3. A screening method as claimed in claim 1, wherein the ceramic capacitors are charged at room temperature.

4. A screening method as claimed in claim 1, wherein the ceramic capacitors are charged at a temperature around the maximum working temperature.

5. A screening method as claimed in claim 1, wherein the residual voltage values of the ceramic capacitors are measured at room temperature.

6. A screening method as claimed in claim 1, wherein the residual voltage values of the ceramic capacitors are measured at a temperature around the maximum working temperature.

* * * * *